United States Patent [19]

Meador

[11] 4,385,279
[45] May 24, 1983

[54] TUNABLE HELICAL RESONATOR

[75] Inventor: Richard B. Meador, Sunrise, Fla.

[73] Assignee: Motorola, Inc., Schaumburg, Ill.

[21] Appl. No.: 289,868

[22] Filed: Aug. 4, 1981

[51] Int. Cl.³ ............................ H01P 7/00; H01P 7/06
[52] U.S. Cl. .................................... 333/235; 333/202
[58] Field of Search ............... 333/202, 208, 209, 212, 333/219, 222–224, 227, 226, 231, 232, 235, 175–176, 185, 245, 246, 229; 334/68, 81; 336/69, 130

[56] References Cited

U.S. PATENT DOCUMENTS

| | | | |
|---|---|---|---|
| 2,394,391 | 2/1946 | Martowicz | 343/68 |
| 2,502,202 | 3/1950 | Burroughes | 334/81 X |
| 2,516,287 | 7/1950 | Aske | 334/68 |
| 2,531,231 | 11/1950 | Million, Jr. | 334/81 X |
| 2,566,759 | 9/1951 | Clark et al. | 333/224 |
| 2,622,203 | 12/1952 | Kiebert, Jr. et al. | 336/79 X |
| 2,638,544 | 5/1953 | Schreiner | 333/219 |
| 2,780,727 | 2/1957 | Dreyer, Jr. | 334/68 |
| 2,980,797 | 4/1961 | Million, Jr. | 334/81 X |
| 3,247,475 | 4/1966 | Buetow et al. | 333/231 |
| 3,264,587 | 8/1966 | Leng | 333/231 |
| 3,387,236 | 6/1968 | Womack, Jr. | 333/224 |
| 3,571,768 | 3/1971 | Gundry | 333/230 |
| 3,581,249 | 5/1971 | Spangler et al. | 333/185 |
| 3,601,723 | 8/1971 | Johnson | 333/230 X |
| 3,688,226 | 8/1972 | Mezey | 333/174 |
| 3,825,862 | 7/1974 | Koizumi | 333/231 |
| 4,052,684 | 11/1977 | Schmalz | 333/223 |
| 4,061,992 | 12/1977 | Inokuchi | 333/202 |
| 4,205,286 | 5/1980 | Parish | 333/226 |
| 4,284,966 | 8/1981 | Wanat | 333/202 |

Primary Examiner—Marvin L. Nussbaum
Attorney, Agent, or Firm—John B. Conklin; Donald B. Southard; Edward M. Roney

[57] ABSTRACT

A helical cavity resonator having a grounded shield, a hollow coil form and associated quarter wavelength wire coil. A non-ferrous conductive slug can be adjusted to variable positions inside the hollow coil form. Placement of the slug in a region proximate to the inside of the wire coil tunes the cavity resonator in a predominately inductive manner. Changing the slug position in the bore so that it is proximate to the shield top and removed from the inside of the wire coil tunes the cavity resonator in a predominately capacitive manner. By utilizing both inductive and capacitive tuning a helical cavity resonator with a wide tuning range is realized while maintaining a simple, inexpensive construction.

5 Claims, 7 Drawing Figures

TUNABLE HELICAL RESONATOR

BACKGROUND OF THE INVENTION

1. Field of the Invention

This invention relates in general to helical cavity resonators and more particularly to tunable helical cavity resonators utilizing both inductive and capacitive tuning to simultaneously achieve wide tunable frequency range and low insertion loss.

2. Prior Art

In communications applications helical cavity resonators are well known and widely used circuit elements. They resonate at a frequency for which the shielded cavity and the length of the wire comprising the helix within the shield are substantially a quarter wave length long.

In the helical cavity resonator art the distributed inductance and capacitance which establish the resonant frequency are determined by the physical dimensions of the cavity, the helical coil and its support member. Therefore, to design a tunable helical cavity resonator for resonance over a particular frequency band, exact and precise construction is required. Every dimension in a helical cavity resonator is critical to some degree of exactness.

In the past, to tune a helical cavity resonator it was customary to vary either the inductive characteristics or the capacitive characteristics of the resonator. To provide a capacitively tunable helical resonator it is known to use a grounded metal screw inserted into the cavity in proximity of the high impedance end of the helix coil and secured by screw threads in the grounded shield. By adjusting the physical distance between the top of the helix conductive wire and the grounded metal screw, the capacitive characteristics of the cavity walls resonator can be changed.

An alternate method of capacitive tuning is to provide a dielectric cap which is movable relative to the wire helix and the resonator cavity walls, thereby displacing the air in the space between the helix and the cavity walls resulting in a change in distributed capacitance between the wire helix and the cavity walls.

For inductive tuning of a helical cavity resonator it is known that insertion of a metal slug within the hollow formed by the wire helix coil reduces the total inductance of the helix coil thus varying the inductance of the cavity as the slug is moved within the hollow. The change in inductance is caused by circulating currents induced in the slug by the wire helix which in turn induce a counter emf in the wire helix.

These prior art approaches have shortcomings from the standpoint of limited tuning range, difficulty in fabrication, poor tuning accessability and relatively high manufacturing costs. Moreover, their performance is inferior in other aspects and their use in communication equipment is limited. Tunable cavity resonators represent a considerable portion of the cost of radio apparatus, and hence ways are constantly being sought to make such resonators as inexpensive as possible especially where high volume manufacturing is involved. In view of these considerations, a need exists for a low cost helical cavity resonator with a wide tunable frequency range, low insertion loss and easy tuning.

It is the general objective of this invention to provide an improved helical cavity resonator that over comes the foregoing deficiencies.

More particularly, it is the object of this invention to provide a helical cavity resonator which has an increased usable frequency range.

It is another object of this invention to provide an assembly process for a helical cavity resonator that has only a few steps and results in an inexpensive, high yield construction.

It is still another object of this invention to provide a helical cavity resonator that contains a low loss extension piece attached to the tuning slug allowing for easy adjustment from outside the wire helix with the use of a suitable tool.

SUMMARY OF THE INVENTION

Briefly, the invention is directed to a helical cavity resonator which utilizes both inductive and capacitive tuning so as to create an increase in usable tuning frequency while maintaining a simple construction when compared to other low cost helical cavity resonators which are tunable only in a inductive or capacitive manner. The resonator device comprises a non-ferrous conductive tuning slug inserted into a hollow coil form, the coil form itself is positioned inside a grounded metallic shield which defines the boundaries of the cavity. A wire is space wound around the coil form. A first end of the wire is grounded. A second end is capacitively coupled to the top of the shield through the distributed capacitance of the cavity. The tuning slug travels along the hollow of the coil form in such a manner as to affect both the inductance and capacitance of the cavity. With critical attention paid to the distance between the top of the grounded shield and the second end of the wire in a resonator construction, the presence of the tuning slug in the upper region of the cavity space will predominately effect the distributed characteristic capacitance of the helical cavity resonator. Movement of the tuning slug toward the central region of the cavity serves to bring the tuning slug in proximity of the helix formed by the wound wire. Thus the characteristic inductance of the resonator is predominately effected. The combined effect of varying both capacitance and inductance results in a broader usable frequency range than if only one of the two characteristics are variable, as in the prior art.

DESCRIPTION OF THE PREFERRED EMBODIMENT

Figure 1:
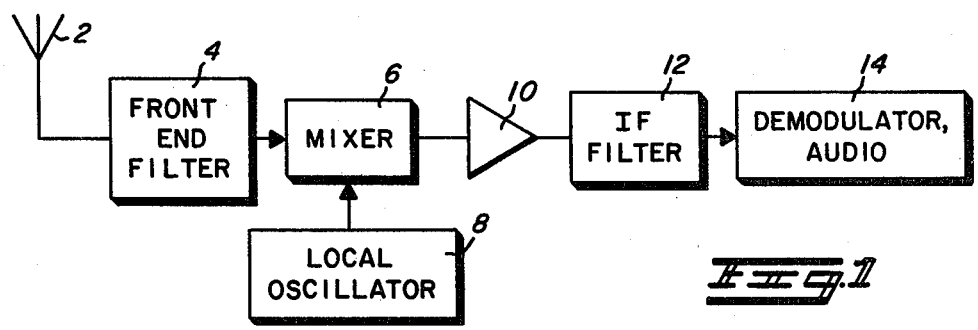
FIG. 1 is a block diagram of the fundamental components of a standard UHF radio receiver.

FIG. 1 shows a block diagram of a typical receiver system which may advantageously utilize the helical cavity resonator of the instant invention. An electromagnetic signal received by antenna 2 is directed to the front end filter 4. The front end filter is intended to pass the desired bandpass frequencies while attenuating other frequencies. It is well known that helical cavity resonators are desirable components for the front end filter when operation is in the UHF range. The filtered signal is applied to the mixer 6 where the signal is combined with a frequency from a local oscillator 8. While the desired information signal from the front end filter is usually a UHF signal, the signal from local oscillator 8 is a UHF frequency offset by an IF or intermediate frequency. The mixed signal from mixer 6 is amplified by amplifier 10. Then the unwanted mixing signals are removed by IF filter 12 and the information carrying IF signal, is delivered to a demodulator or audio converter 14.

Figure 2:
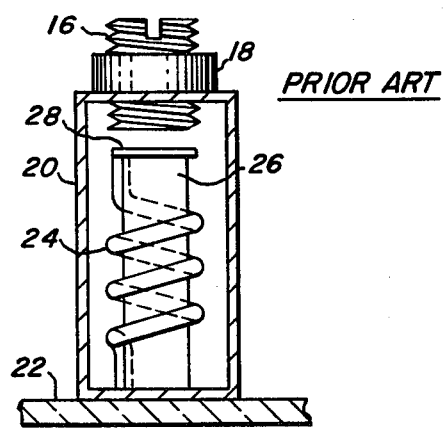
FIG. 2 is a cross sectional view of a prior art capacitively tunable helical resonator.

FIG. 2 shows a prior art helical cavity resonator with capacitive tuning. A metal tuning screw 16 is fitted into a threaded opening 18 in the top of rectangularly shaped shield 20. The shield 20 and metal tuning nut 16 are grounded to the ground plane of circuit board 22. A approximately quarter wave length wire 24 is wrapped in a helix on a coil form 26. The lower end of wire 24 is grounded to a ground plane on circuit board 22. A conductive plate 28 is attached to the high impedance end of the wire 24 and is situated atop coil form 26. By turning the tuning screw 16 by some suitable means, such as a screwdriver, the physical distance between the conductive plate 28 and the turning screw 16 can be varied. By varying this distance, the characteristic distributed capacitance of the cavity is changed. This construction gives a satisfactory tunable frequency range for resonant frequencies in some applications but, in any event, is more costly to construct than is desirable for low cost systems. Also, because both the tuning screw 16 and threaded opening 18 are metal there is a tendency for the screw to move when subjected to vibration thus detuning the resonator. To combat this tendency, the tuning screw 16 is often made with several small strips of plastic inserted in a recess along the length of the screw. Finally it is common to plate the tuning screw 16, preferably with gold, in order to insure good grounding contact between the screw and the grounded shield 20. Of course, all this adds to the expense of the construction of the resonator.

Figure 3:
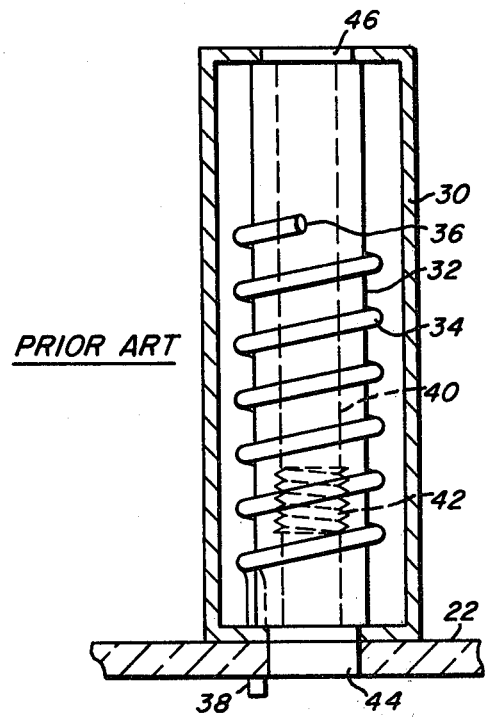
FIG. 3 is a cross sectional view of a prior art inductively tunable helical resonator.

FIG. 3 shows a prior art helical cavity resonator with inductive tuning. Shield 30 is grounded to a ground plane associated with circuit board 22. A coil form 32 is positioned within the shield 30 with quarter wavelength wire 34 wrapped in a helix around the coil form. The wire has a high impedance end 36 and a low impedance end 38. The coil form 32 includes a hollow bore 40 which is threaded throughout its length. A threaded metal tuning slug 42 is screwed into the hollow bore 40 and serves to vary the distributed inductance of the cavity. An adjustment tool can be used to adjust the position of tuning slug 42 through an access hole 44 in circuit board 22. The tuning slug 42 can be screwed all the way up the hollow bore 40 and out the opposite end of the cavity through a second hole 46. Tuning of the slug 42 is usually restricted to inside the lower region of the helix shaped quarter wavelength wire 34 because of "windage". The problem of windage relates to the insertion of a tuning tool into the bore region surrounded by the coiled wire 34 which changes the electrical characteristics and thus the resonant frequency of the resonator cavity. The frequency shifts resulting from the insertion and removal of the tuning tool increase the difficulty of adjusting the cavity to a desired resonant frequency. The region of the hollow bore 40 above the high impedance end 36 of the wire 34 gives no tuning effect at all with the presence of the tuning slug 42.

Figure 4:
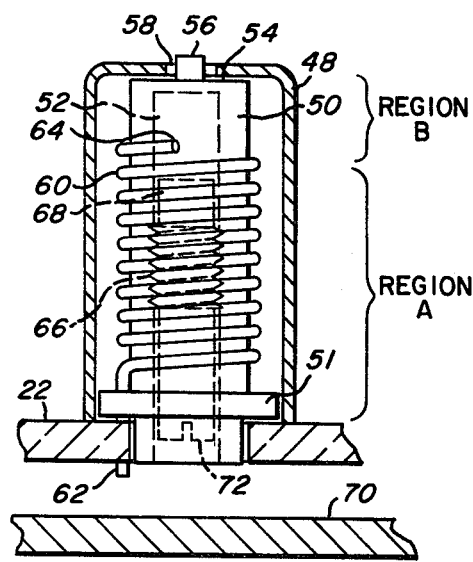
FIG. 4 is a cross sectional view of a helical cavity resonator constructed in accordance with the present invention.
Figure 5:
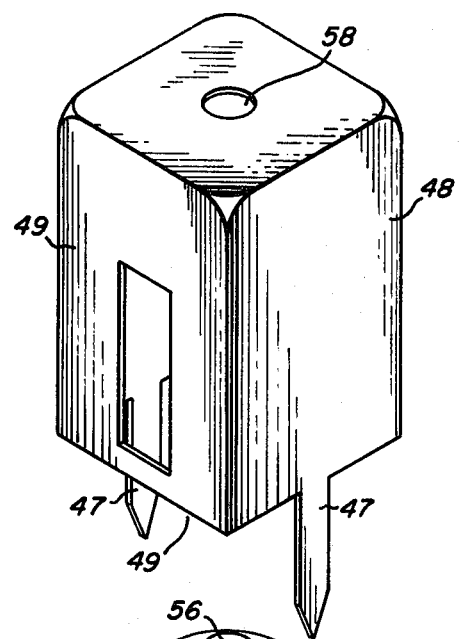
FIG. 5 is an exploded view the helical cavity resonator of FIG. 4.

FIGS. 4 and 5 respectively give a cross-section and exploded view of the helical cavity resonator according to the instant invention. The shield 48 is grounded to a ground plane associated with circuit board 22 in a well known manner similar to the ground shields of prior art FIGS. 2 and 3. The shield 48 is preferably rectangular in shape with an open bottom 49 in FIG. 5. It is made of a conductive metal such as tin plated copper or other suitable material. Two prongs 47, shown in the exploded view in FIG. 5, extend from the side portions of shield 48 to allow the shield to be effectively attached to circuit board 22 and grounded to an associated ground plane. The coil form 50 is generally cylindrical in shape with a square base section 51 formed to fit into the square space defined by the four interior side walls of shield 48. Preferably the coil form 50 is made of a low dielectric substance such as polypropylene. The coil form 50 includes a threaded hollow base 52 preferably closed at the coil form top end 54. A tip piece 56 is formed at the coil form top end 54 and fitted through a small hole 58 in the top of shield 48. The tip piece 56 engages the small hole 58 of the shield 48 and functions to align the coil form 50 within the interior of the shield 48. A wire 60, approximately a quarter wavelength long, is space wound to form a helix about cylindrical coil form 50. The wire 60 is preferably copper and has a low impedance end 62 coupled to a ground plane associated with circuit board 22 and a opposite high impedance end 64 capacitively coupled to the top of the grounded shield 48 through the distributed capacitance inherent in the space between the high impedance end 64 of wire 60 and the top of shield 48. A threaded low loss extension piece 66, preferably polystyrene or a ceramic, is capped by a hollow non-ferrous conductive slug 68 preferably made of copper, brass or aluminum. The slug is crimped to hold it in place. The conductive slug may also be formed by depositing a thick metal film on the end of the extension piece 66 by electrolysis or by bonding the slug 68 directly to the end of the extension piece 66 with a suitable low loss epoxy.

By threading the extension piece 66 into the hollow bore 52 the non-ferrous conductive slug 68 can be adjusted along the length of the bore 52. Adjustment of the slug 68 by the extension piece 66 within the wire 60 region of the bore 52, shown as REGION A in FIG. 4, achieves a tuning effect that is primarily inductive in character. Further adjustment of the tuning slug 68 into the cavity region of the bore immediately above the high impedance end of the wire 60, shown as REGION B in FIG. 4, gives a predominately capacitive tuning effect if the relative dimensions of the cavity are correct. The capacitive tuning effect displayed in REGION B is critically dependent on the dimensions of REGION B as defined by the distance between the top of the grounded shield 48 and the high impedance end 64 of the wire 60. If the distance is too little or too great as it relates to the other cavity dimensions, little or no capacitive tuning effect will be observable.

It has been found that the following dimensions for the helical cavity resonator of FIGS. 4 and 5 give the desired capacitive and inductive tuning effect. In the preferred embodiment, the shield 48 is approximately 525 mils in height and 320 mils on a side. The cylindrical coil form 50 diameter is such that the space wound wire 60 has a helix diameter of 205 mils. The wire is preferably 30 gauge copper wire. To hold the wire 60 on the coil form 50 the coil form is threaded with a V cut on its outside surface at 44 turns per inch. The coil form 50 is preferably made of a plastic such as polypropylene and formed by injection molding. The wire length, for a frequency range of 420 MHz to 495 MHz is approximately 11 turns on the V cut of the coil form 50. The tuning slug 68 is preferably approximately 130 mils in diameter and approximately 90 mils in length. The extension piece length is approximately 270 mils. The square base 51 of the coil form 50 is approximately 115 mils thick. Input coupling to the cavity is a direct tap at approximately 0.4 turns. Other coupling methods well known to those skilled in the art, loop coupling for example, could also be used. From these dimensions the distance between the high impedance end 64 of coil form 50 and the top of the shield 48, or REGION B is approximately 150 mils. If the distance is too great, (i.e. more than 210 mils,) the capacitive tuning effect will not be observed. If the length of REGION B is considerably less than 150 mils the top of the grounded shield dominates the cavity performance and drastically changes its characteristics.

Figure 6:
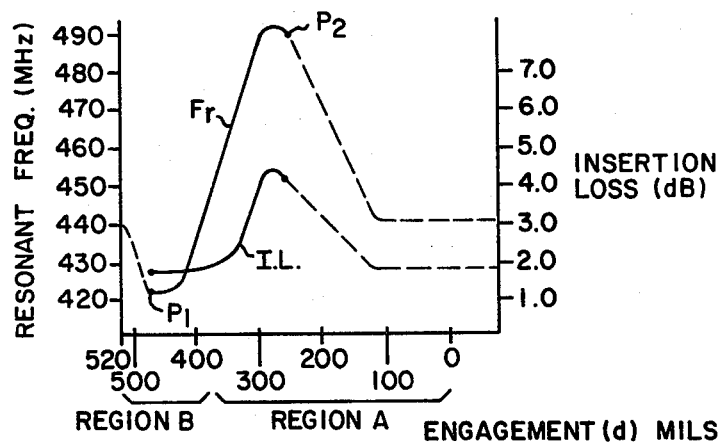
FIG. 6 is a graphical representation of the insertion loss and resonator frequency versus tuning slug position for the helical cavity resonator of the invention.

In order to more carefully define the available tuning range of the cavity resonator of FIGS. 4 and 5 and to prevent multiple position tuning to the same frequency, as will be more fully explained in conjunction with FIG. 6, the hollow bore 52 has been closed at its top end to an approximate thickness of 50 mils. Another physical tuning endpoint is defined by the position of the tuning slug 68 when its associated extension piece 66 is flush with the bottom plane of circuit board 22. The physical prohibition from extending the end 72 of the extension piece 66 beyond the circuit board bottom plane is provided by a chassis back cover 70 in the cross section view of FIG. 4 which is fitted snugly against the circuit board 22 bottom plane.

FIG. 6 is a graphic display of both resonate frequency and insertion loss versus tuning slug engagement for the helical cavity resonator of the instant invention with the dimensions given for the preferred embodiment. Tuning slug position is measured along the X-axis in the graph of FIG. 6. The graph line $P_1 P_2$ is related to the left hand abscissa marked in Megahertz. The graph line I.L. is associated with the right hand abscissa which is marked in db (decibels) as a means for measuring insertion loss. The dotted line portion of the graph together with the solid line portion shows the total response of a resonator according to FIGS. 4 and 5 having the dimensions of the preferred embodiment if the tuning slug 68 were allowed to travel the entire vertical distance of the height of the shield 48. REGION A on the graph of FIG. 6, corresponds to REGION A in FIG. 4. Similarly, REGION B on the graph of FIG. 6, corresponds to REGION B in FIG. 4. Point $P_1$ on the resonant frequency plot of the FIG. 6 graph corresponds to the first tuning endpoint of the cavity resonator in FIG. 4 defined by the 50 mils thick closed top of the coil form top end 54. Point $P_2$ on the resonant frequency plot of the FIG. 6 graph corresponds to the second tuning endpoint of the FIG. 4 resonator defined by the back cover 70 prohibiting the extension piece end 72 from extending beyond the bottom plane of the circuit board 22.

As can be seen from the graph in FIG. 6, without endpoint $P_1$ and $P_2$, the tuning slug 68 can physically move from a full engagement, to an approximate zero engagement (the end of REGION A) corresponding to a top to bottom movement of the tuning slug 68 in FIG. 4. Starting from full engagement at the top of the resonator such top to bottom movement initially serves to increase the distributed characteristic capacitance of the cavity. Since the resonant frequency of the cavity is proportional to $1/\sqrt{L_e C_e}$ the resonant frequency decreases from 440 MHz to 420 MHz at approximately a 460–470 mils engagement as shown in FIG. 6. Further movement of the tuning slug 68 down the hollow bore 52 reduces the slugs effect on the distributed characteristic capacitance and increases its effect on the distributed characteristic inductance of the resonator. As the tuning slug 68 moves close to and then into the helix of wire 60 the distributed characteristic inductance is decreased thus causing the resonant frequency of the cavity to increase up to a maximum at approximately 250 mils engagement. Further disengagement of the tuning slug 68 (downward movement in FIG. 4) reduces the slugs effect on the distributed characteristic inductance of the cavity and thus causes the resonant frequency to decrease to a point, at approximately 90 mils on the FIG. 6 graph, where the tuning slug 68 no longer exhibits any observable effect on the cavity characteristics.

Figure 7:
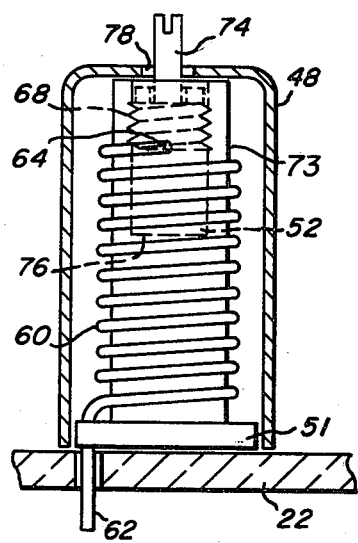
FIG. 7 is a cross sectional view of a helical cavity resonator according to an alternate embodiment of the invention.

FIG. 7 shows a cross-sectional view of an alternate embodiment of a helical cavity resonator according to the invention. This construction differs from the previously described embodiment basically in that it is tunable from the top of the shield. The critical dimensions of the FIG. 7 embodiment are the same as those given for the embodiment of FIGS. 4 and 5. Where reference numbers in FIG. 7 are common with those of the FIGS. 4 and 5 embodiment they indicate similar parts. A grounded shield 48 is positioned on a circuit board 22 with an injection molded coil form 73 fitted within the shield 48 and positioned by its base 51 and extension piece 74. The wire 60 is space wound on the coil form 73 in a similar manner as the embodiment of FIGS. 4 and 5. The low impedance end of the wire is grounded to a ground plane on circuit board 22. The tuning slug 68 moves over the same area of hollow bore 52 as it does in the preferred embodiment of FIGS. 4 and 5. With tuning at the top, the lower stop for tuning slug 68 is provided by the coil form itself at 76. The hollow base extends down only to the point graphically corresponding to point $P_2$ in FIG. 7. The extension piece 74 provides the top stop. Preferably the extension piece 74 in FIG. 7 has two pieces of different diameters. The first and larger diameter is in a bonded or capped engagement with the metal tuning slug 68 and prevents the slug 68 from entering the region in the graph of FIG. 6 to the left of point $P_1$. The second piece is of a smaller diameter and extends through the top of the grounded shield 48 through a hole of similar diameter as that of the second piece. The top of the second piece is notched to allow for easy tuning.

In summary it can be appreciated that the improved construction of a helical cavity resonator described herein provides both capacitive and inductive tuning which results in a wide frequency range with low loss while simultaneously allowing for a simple construction and, thus, inexpensive manufacturing.

I claim:

1. An improved helical cavity resonator construction comprising:
   a metallic shield having at least one side portion, a coil wrapped around a hollow coil form and having a grounded first end and a second end, a non-ferrous conductive slug adapted to be positioned within said hollow coil form, said cavity arrangement having a first region defined by the relative distance between said side portion of said shield and the said second end of said coil, and a second region defined by the relative distance between said second end of said coil and the said grounded first end of said coil, whereby movement of said metal slug in said first region achieves capacitive tuning and movement of said slug in said second region achieves inductive tuning.

2. An improved helical cavity resonator construction according to claim 1 wherein said slug has an extension piece attached thereto for adjusting the position of said slug within said hollow coil form.

3. An improved helical cavity resonator construction according to claim 1 wherein said slug is ungrounded.

4. An improved helical cavity resonator construction according to claim 2 wherein said hollow coil form has a first and second end and wherein said hollow coil form first end is closed and said slug and extension piece extend into said hollow coil form second end.

5. A method of tuning a helical cavity resonator by adjusting both the characteristic capacitance and inductance of the cavity, said helical cavity resonator having a non-ferrous conductive tuning slug capable of movement in a first and second region of the cavity, the method comprising the steps of:

a. inserting said non-ferrous conductive tuning slug into a first region of the cavity for adjustment of the characteristic inductance, b. further inserting the metal tuning slug into a second region of the cavity for adjustment of the characteristic capacitance, c. adjusting the position of said non-ferrous conductive slug within the said two regions until the desired resonant frequency is obtained.

* * * * *